United States Patent [19]

Tanaka et al.

[11] 3,986,150

[45] Oct. 12, 1976

[54] REED TYPE ELECTROMECHANICAL FILTER DEVICE

[75] Inventors: Toshiharu Tanaka; Masao Akimoto, both of Kadoma, Japan

[73] Assignee: Matsushita Electric Industrial Co., Ltd., Japan

[22] Filed: Mar. 10, 1975

[21] Appl. No.: 557,027

[30] Foreign Application Priority Data
Mar. 13, 1974 Japan.................................. 49-29314

[52] U.S. Cl................................. 333/71; 310/8.2; 310/8.6; 333/72
[51] Int. Cl.² .................... H03H 9/04; H03H 9/26; H03H 9/32; H01L 41/10
[58] Field of Search............. 333/72, 71; 310/8–8.6, 310/9–9.1, 9.4–9.8, 25, 26; 331/109, 156; 58/23 TF; 84/409, 457

[56] References Cited
UNITED STATES PATENTS

| | | | |
|---|---|---|---|
| 3,054,915 | 9/1962 | Houck | 310/9.1 |
| 3,614,485 | 10/1971 | Cosman et al. | 333/72 X |
| 3,621,467 | 11/1971 | Dostal | 310/25 |

*Primary Examiner*—Alfred E. Smith
*Assistant Examiner*—Marvin Nussbaum
*Attorney, Agent, or Firm*—Robert E. Burns; Emmanuel J. Lobato; Bruce L. Adams

[57] ABSTRACT

Herein disclosed is a reed type electromechanical filter device which comprises a vibrator element having a pair of spaced parallel arm portions adapted to vibrate in lateral directions, a pair of piezoelectric ceramic plates or electromechanical transducer elements mounted on the arm portions of the vibrator element, and a pair of elastic metal members respectively mounted on the outer side faces of the arm portions and/or a pair of elastic metal members respectively mounted on the inner side faces of the arm portions. The elastic metal members are effective to prevent the arm portions from directly striking against each other and/or the inner faces of side walls of a housing enclosing the vibrator element in the event the filter device is subjected to a violent impact which would otherwise cause deterioration of the performance quality of the filter device.

19 Claims, 10 Drawing Figures

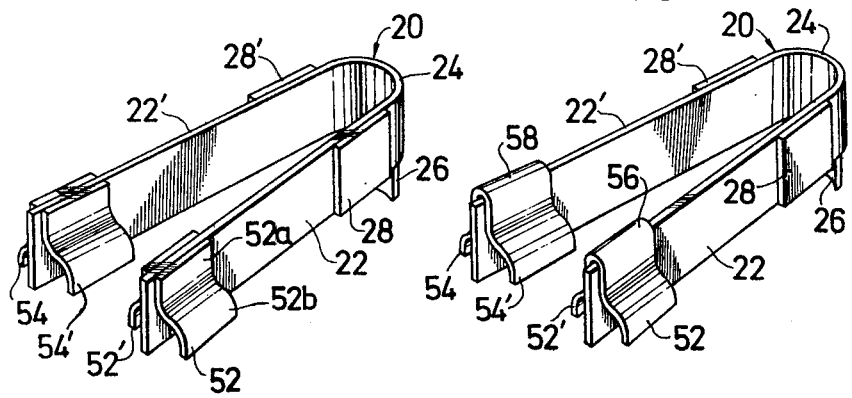
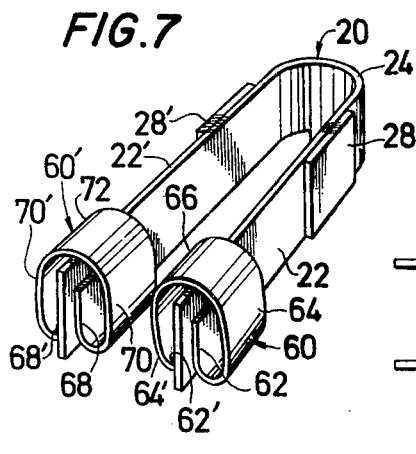
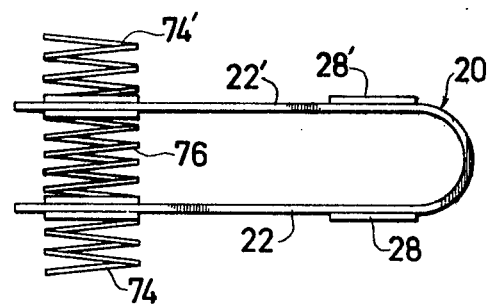
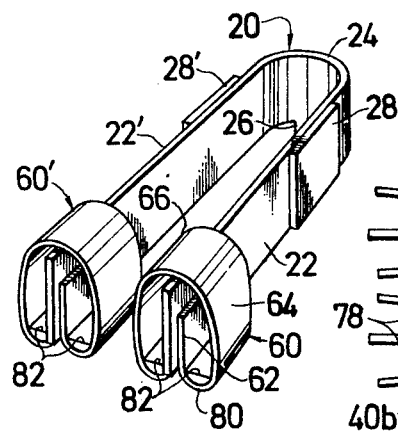
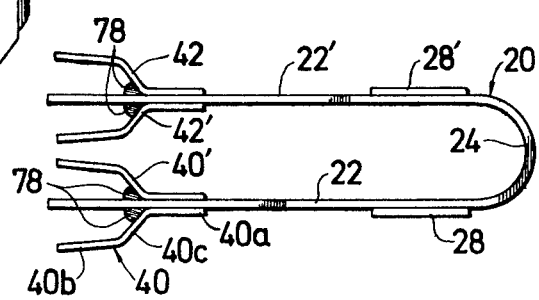

REED TYPE ELECTROMECHANICAL FILTER DEVICE

BACKGROUND OF THE INVENTION

The present invention relates to electromechanical filter devices and, more particularly, to reed type electromechanical filter devices for use with various radio communication equipment and electrical control devices.

A reed type electromechanical filter device uses a generally fork-shaped vibrator element having a pair of spaced parallel arm portions which are adapted to vibrate in lateral directions about a nodal axis located in an intermediate base portion through which the arm portions merge into each other. Piezoelectric ceramic plates are fixedly mounted on the outer side faces of the arm portions, respectively, of the vibrator element by means of adhesive. The piezoelectric ceramic plates operate as electromechanical transducer elements converting mechanical vibrations of the arm portions of the vibrator element into currents with frequencies within an audible range. The filter devices of this character have been extensively used in the field of communication and control devices and instruments by reason of the stable frequency characteristics.

Because, however, of the fact that the arm portions of the vibrator element are usually allowed to warp at relatively large angles between side walls of a housing which encloses the vibrator element, problems have been encountered which result in critical deterioration of the performance quality of the filter device. When, for example, the filter device happens to fall to a hard floor surface or struck by a hard object and undergoes a violent impact, the arm portions of the vibrator element tend to be unusually warped and would forcefully strike against each other or the inner faces of the side walls of the housing. If the arm portions of the vibrator element are thus seriously defomred or subjected to a violent impact, the piezoelectric ceramic plates susceptible to mechanical shocks are liable to be ruptured and/or cracks may be produced in the layers of the metal-to-metal adhesive bonding the ceramic plates to the arm portions of the vibrator element. This causes diminution of the resonance frequency of the filter device and gives rise to an increase in the insertion loss of the device so that the filter device becomes no longer serviceable. Such a damage will be particularly serious when an impact is applied to the filter device in a direction in which the arm portions of the vibrator element are to vibrate.

As is well known in the art, moreover, it is a widely accepted practice to have the resonance frequency of the filter device minutely adjusted during production of the filter device by applying controlled quantities of adhesive to the arm portions of the vibrator element for furnishing the vibrator element with additional masses. The adhesive is, however, initially in a liquid state and for this reason tends to creep or flow on the surfaces of the vibrator element so that extreme difficulties are encountered in accurately controlling the quantities, locations and distributions of the additional masses on the vibrator element. If the additional masses of the adhesive applied to the surfaces of the vibrator element fail to have proper quantities and are distributed irregularly, the equilibrium between the modes of vibration of the two arm portions of the vibrator element will be destroyed and, again, the filter device will become useless.

The present invention contemplates elimination of all these drawbacks which have been encountered in the prior art reed type electromechanical filter devices of the described nature.

SUMMERY OF THE INVENTION

It is, accordingly, an important object of the present invention to provide an improved reed type electromechanical filter device having a resonance frequency which will not be impaired even though the filter device may be subjected to a violent impact during use.

It is another important object of the invention to provide an improved reed type electromechanical filter device providing an insertion loss which remains practically unaffected by an impact applied to the filter device.

It is still another important object of the invention to provide an improved reed type electromechanical filter device which has means adapted to prevent the vibrator element of the filter device from being warped excessively so that the piezoelectric ceramic plates mounted on the vibrator element can be protected from being damaged when the filter device undergoes a forceful impact.

It is still another important object of the invention to provide an improved reed type electromechanical filter device which can be readily and accurately adjusted for proper resonance frequency simply by applying controlled quantities of metal-to-metal adhesive to the vibrator element of the filter device during production.

Yet, it is another important object of the present invention to provide an improved reed type electromechanical filter device having a simple configuration and economical to manufacture on a commercial basis.

In accordance with the present invention, these and other objects will be accomplished basically in a reed type electromechanical filter device which comprises a vibrator element having a pair of spaced parallel arm portions which merge into each other through an intermediate base portion having a nodal axis of vibration and which have respective free ends opposite to the base portion, a pair of electromechanical transducer elements fixedly mounted on the arm portions, respectively, of the vibrator element in the neighbourhood of the intermediate base portion of the element, a pair of elastic metal members fixedly mounted on the arm portions, respectively, of the vibrator element and elastically deformable in directions in which the arm portions of the vibrator element are to vibrate, and a housing enclosing the vibrator element, the transducer elements and the elastic metal members and having the intermediate base portion of the vibrator element fixedly mounted on an inner face of the housing. The elastic metal members may be fixedly attached to the outer or inner side faces of the arm portions or, if desired, another pair of elastic metal members essentially similar to the former may be provided so that each of the arm portions of the vibrator element is fitted with two elastic metal member which are fixedly attached to the outer and inner side faces of the arm portion. The two elastic metal members thus mounted on each of the arm portions of the vibrator element may be connected integrally with each other by a ridge portion which extends over one longitudinal edge of the arm portion carrying the two elastic metal members.

Each of the elastic metal members may be in the form of either a leaf spring or a helical spring.

The reed type electromechanical filter device according to the present invention may further comprise, if preferred, an additional mass of metal-to-metal adhesive which is applied to an interspace formed by each of the elastic metal members and which is located in the vicinity of the side face of the arm portion on which the elastic metal member is mounted. Such an interspace may be formed between the side face of each of the arm portions of the vibrator element and a portion of each of the elastic metal members which is located in close proximity to each of the side face of the arm portion on which the elastic metal member is mounted. As an alternative, the interspace may be formed in such a manner that each of the elastic metal members has a curved portion having an inner face by which the above mentioned interspace is defined.

BRIEF DESCRIPTION OF THE DRAWINGS

The features and advantages of the reed type electromechanical filter device according to the present invention will become more apparent from the following description in which like reference numerals designate corresponding members and elements throughout the figures and in which:

FIG. 5 is a perspective view showing part of a third preferred embodiment of the reed type electromechanical filter device according to the present invention;

FIG. 6 is a perspective view showing part of a fourth preferred embodiment of the reed type electromechanical filter device according to the present invention;

FIG. 7 is a perspective view showing part of a fifth preferred embodiment of the reed type electromechanical filter device according to the present invention;

FIG. 8 is a plan view which shows a part of a sixth preferred embodiment of the reed type electromechanical filter device according to the present invention;

FIG. 9 is a plan view showing a modification of the embodiment illustrated in FIG. 2; and FIG. 10 is a perspective view showing a modification of the embodiment illustrated in FIG. 7.

DESCRIPTION OF THE PREFERRED EMBODIMENTS

Figure 1:
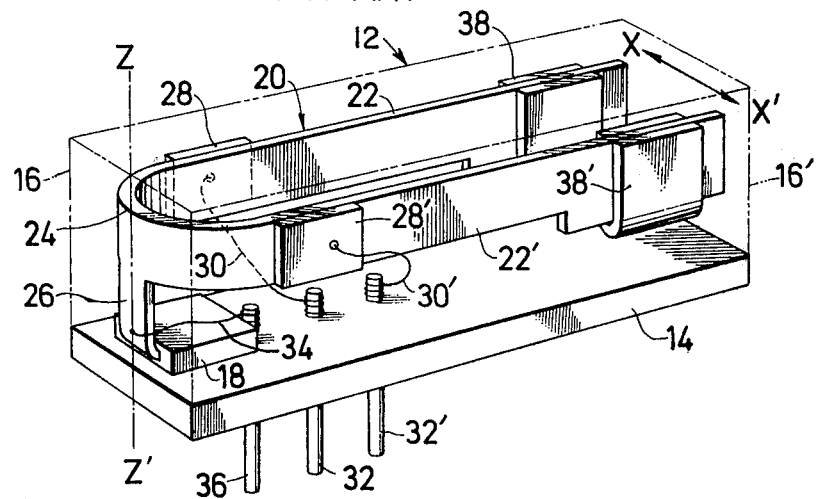
FIG. 1 is a perspective view which schematically shows a representative example of a reed type electromechanical filter device to which the present invention appertains.

Reference will now be made to the drawings, first to FIG. 1 which shows a representative example of a prior art reed type electromechanical filter device. The prior art reed type filter device comprises a housing 12 consisting of a base wall 14 and a cover structure having side walls 16 and 16'. The base wall 14 has fixedly mounted on its inner face a support member 18 which may be formed of metal, plastic or rubber. Within the housing 12 thus constructed is enclosed a generally U-shaped vibrator element 20 which has a pair of spaced parallel arm portions 22 and 22' extending over the inner face of the base wall 14 in parallel with the side walls 16 and 16' of the housing 12. The arm portions 22 and 22' merge into each other through an intermediate base portion 24 and have respective free ends which are opposite to the intermediate base portion 24. The base portion 24 is formed with a projection 26 through which the vibrator element 20 is fixedly secured or cantilevered to the support member 18 on the base wall 14 of the housing 12. The arm portions 22 and 22' of the vibrator element 20 thus configured are operative to vibrate in directions at right angles to the directions of elongation of the arm portions, viz., in lateral directions indicated by arrowheads X and X' about a nodal axis Z—Z' which is located at the center point of the intermediate base portion 24. The projection 26 from the base portion 24 is usually aligned with the nodal axis Z—Z'. While the projection 26 has been assumed to be integral with the base portion 24, the vibrator element 20 may be fixedly secured to the support member 18 by means of a rigid independent member (not shown) which is connected at one end to the base portion 24 of the vibrator element 20 and at the other end to the support member 18 if desired.

A pair of piezoelectric ceramic plates 28 and 28' serving as electromechanical transducer elements are securely bonded to the outer side faces of the arm portions 22 and 22', respectively, of the vibrator element 20 by an adhesive. The piezoelectric ceramic plates 28 and 28' are usually located in the neighbourhood of the intermediate base portion 24 and in symmetry with respect to the nodal axis Z—Z' of the vibrator element 20. The ceramic plates 28 and 28' have respective outer faces which are coated with films (not shown) of conductive material for electrical connection to external electric appliances such as radio equipment or electric control devices. In FIG. 1, there are shown incoming and outgoing lead wires 30 and 30' which are anchored each at one end to the conductive films on the ceramic plates 28 and 28', respectively, and which are connected at the other ends to terminal members 32 and 32', respectively, which project out of the housing 12 through the base wall 14 of the housing. Likewise, a lead wire 34 is anchored at one end to the projection 26 of the base portion 24 of the vibrator element 20 and is connected to a terminal member 36 also projecting out of the housing 12 through the base wall 14 thereof. The terminal member 36 thus electrically connected to the vibrator element 20 is grounded. Where the filter device thus constructed is intended for application with relatively low resonance frequencies, the filter device further comprises a pair of additional mass members 38 and 38' which are mounted on the arm portions 22 and 22', respectively, of the vibrator element 20 and which are usually located in proximity to the free ends of the arm portions 22 and 22', as shown, so as to reduce the resonance frequency of the vibrator element 20. The additional mass members 38 and 38' are spaced apart from the free ends of the arm portions 22 and 22' of the vibrator element 20 a distance which may be selected depending upon a resonance frequency to be achieved of the filter device. Each of the additional mass members 38 and 38' is shown to have a generally U-shaped cross section forming a pair of spaced parallel wall portions having inner faces securely attached to the inner and outer side faces of each of the arm portions 22 and 22'. Where the filter device is used for relatively high frequency applications, the additional mass members 38 and 38' may be dispensed with.

In the event the filter device thus constructed happens to fall to a hard floor or collide against a hard object and is subjected to a forceful impact, especially in a direction in which the vibrator element 20 is to vibrate, the arm portions 22 and 22' of the vibrator element 20 will be caused to usually warp in lateral directions and would violently strike against each other and/or the inner faces of the side walls 16 and 16' of the housing 12. In case the arm portions 22 and 22' are thus seriously deformed or subjected to violent impacts, the piezoelectric ceramic plates 28 and 28' carried on the arm portions 22 and 22' may be ruptured and/or cracks may be produced in the layers of the adhesive securing the ceramic plates 28 and 28' to the arm portions 22 and 22', respectively. This will cause critical diminution of the resonance frequency and deterioration of insertion loss characteristics of the filter device and will ultimately disable the filter device to normally operate. Such a tendency will be pronounced if an impact is imparted to the filter device in the direction X—X' of vibration of the vibrator element 20.

Apart from this, there are cases where the arm portions 22 and 22' of the vibrator element 20 are partly coated with controlled quantities of adhesive for the purpose of providing additional masses and thereby minutely calibrating the resonance frequency of the filter device during production of the filter device. In the prior art filter device having the construction shown in FIG. 1, however, difficulties are encountered for accurately controlling the quantities, locations and distribution of the adhesive applied to the vibrator element 20 because the adhesive which is initially in a fluid state tends to irregularly flow over the surfaces of the arm portions 22 and 22'. If, thus, the masses of the adhesive applied to the two arm portions 22 and 22' of the vibrator element 20 fail to have equal quantities and/or identical patterns, then the equilibrium between the modes of vibration of the two arm portions 22 and 22' is destroyed and is causative of deterioration of the performance quality of the filter device due to, for example, an increase in the insertion loss of the device.

The goal of the present invention is to provide useful solutions to these problems inherent in the prior art reed type electromechanical filter device having the described general construction.

Figure 2:
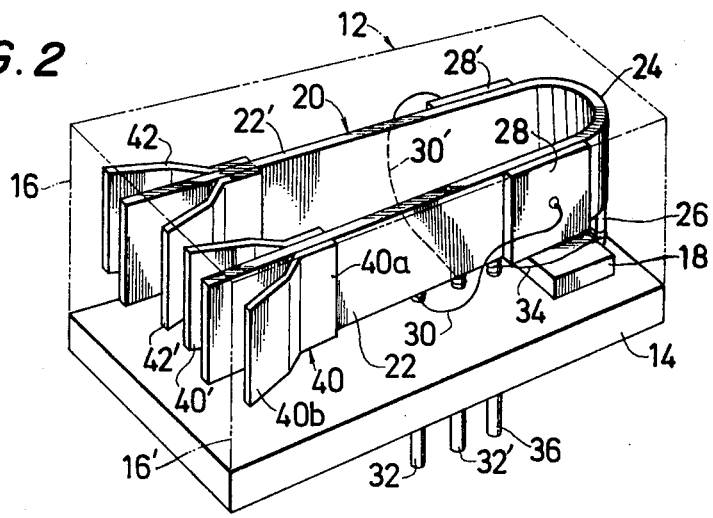
FIG. 2 is a perspective view which shows a first preferred embodiment of the reed type electromechanical filter device according to the present invention.

FIG. 2 illustrates a first preferred embodiment of the filter device adapted to achieve such a goal, wherein members and elements corresponding to those of the prior art device shown in FIG. 1 are designated by like reference numerals. Referring to FIG. 2, the first preferred embodiment of the reed type filter device according to the present invention is provided with a pair of elastic metal members 40 and 40' mounted on the outer and inner side faces, respectively, of one arm portion 22 of the vibrator element 20 and a pair of elastic metal members 42 and 42' mounted on the outer and inner side faces, respectively, of the other arm portion 22' of the vibrator element 20. Each of the elastic metal members 40, 40' 42 and 42' has a base portion which is located at a predetermined distance from the free end of the arm portion carrying the metal member and which is fixedly bonded to the surface of the arm portion by means of a metal-to-metal adhesive. In FIG. 2, the base portion of the elastic metal member 40, for example, is designated by 40a. Each of the elastic metal members 40, 40', 42 and 42' further has an overhang portion (designated by 40b for the metal member 40, for example) which extends from the base portion of the metal member toward the free end of the arm portion carrying the metal member and which juts over the surface of the arm portion on which the metal member is mounted. The overhang portions of all the elastic metal members 40, 40', 42 and 42' are substantially similarly spaced from the side faces of arm portions 22 and 22' to which the elastic metal members are attached and have free ends which are located in the vicinity of the free ends of the arm portions 22 and 22' carrying the metal members, as shown. The overhang portion of each of the elastic metal members 40, 40', 42 and 42' is, thus, elastically movable and deformable toward and away from the side face of the arm portion carrying the metal member when an external force is applied to the overhang portion in a direction substantially normal to the overhang portion or in a direction in which the arm portion carrying the elastic metal member is to vibrate.

In designing the filter device thus constructed, consideration should be paid so that the overhang portions of the elastic metal members 40 and 42 attached to the outer side faces of the arm portions 22 and 22', respectively, are prevented from contacting the inner faces of the sise walls 16 and 16' of the housing 12 and the overhang portions of the elastic metal members 40' and 42' on the inner side faces of the arm portion 22 and 22', respectively, are prevented from contacting each other when the arm portions 22 and 22' are caused to vibrate in lateral directions under normal operating conditions of the filter device.

When, now, the filter device having the construction shown in FIG. 2 happens to be subjected to a violent impact in a lateral direction, viz., in a direction in which the vibrator element 20 of the filter device is to vibrate under the influence of external forces exerted thereon, the arm portions 22 and 22' of the vibrator element 20 are caused to warp about the nodal axis of vibration of the vibrator element 10 under the influence of external forces exerted thereon and are moved or oscillated toward and away from each other and the inner faces of the side walls 16 and 16' of the housing 12. When, under these conditions, the arm portions 22 and 22' of the vibrator element 20 are caused to warp toward the side walls 16 and 16' of the housing 12, then the elastic metal members 40 and 42 on the outer side faces of the arm portions 22 and 22' strike against the inner faces of the walls 16 and 16' so that the overhang portions of the metal members 40 and 42 are elastically warped toward the outer side faces of the arm portions 22 and 22', respectively, on which the metal members 40 and 42 are supported. The arm portions 22 and 22' of the vibrator element 20 are consequently prevented from directly contacting the inner faces of the side walls 16 and 16' of the housing 12 and accordingly from being unusually warped laterally outwardly. When, on the contrary, the arm portions 22 and 22' of the vibrator element 20 are caused to warp laterally inwardly toward each other, the elastic metal members 40' and 42' on the inner side faces of the arm portions 22 and 22' are brought into striking engagement with each other so that the respective overhang portions of the metal members 40' and 42' are elastically warped toward the inner side faces of the arm portions 22 and 22', respectively, on which the metal members 40' and 42' are mounted. The arm portions 22 and 22' of the vibrator element 20 are, in this manner, prevented from directly contacting each other and accordingly from being unusually warped laterally inwardly. The elastic metal members 40, 40', 42 and 42' are, thus, not only adapted to prevent the arm portions 22 and 22' from contacting each other and/or the inner faces of the side walls 16 and 16' of the housing 12 and from being unusually warped in lateral directions but are effective to dampen out the energy of impact applied to the vibrator element 20 and serve as shock absorbers for the vibrator element 20.

Figure 3:
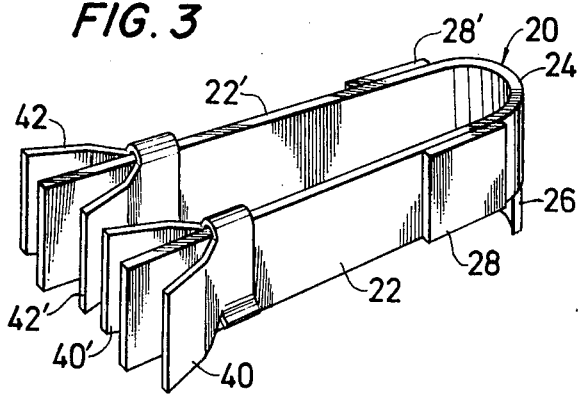
FIG. 3 is a perspective view showing part of a second preferred embodiment of the reed type electromechanical filter device according to the present invention.

FIG. 3 illustrates part of a modification of the embodiment of the filter device shown in FIG. 2. While the elastic metal members 40, 40', 42 and 42' of the filter device shown in FIG. 2 are constructed separately of each other, the elastic metal members 40 and 40' mounted on the arm portion 22 of the vibrator element 20 are integrally connected together by a ridge portion 44 and, likewise, the elastic metal members 42 and 42' on the arm portion 22' of the vibrator element 20 are integrally connected together by a ridge portion 46 in the embodiment shown in FIG. 3. The ridge portion 44 bridging the elastic metal members or, more exactly, portions 40 and 40' straddles over one longitudinal edge of the arm portion 22 of the vibrator element 20 and merges into the respective base portions of the two elastic metal members or portions 40 and 40'. Similarly, the ridge portion 46 bridging the elastic metal members, or portions, 42 and 42' on the arm portion 22' of the vibrator element 20 straddles over one longitudinal edge of the arm portion 22' and merges into the base portions of the elastic metal members or portions 42 and 42'. The configurations of each unitary member thus made up of the elastic metal portions 40 and 40' or 42 and 42' and the ridge portion 44 or 46 is more clearly seen in FIG. 4. The ridge portions 44 and 46 are also formed of elastic metal and have spring actions that are effective to urge the base portions of the elastic metal members or portions 40, 40', 42 and 42' against the side faces of the arm portions 22 and 22' of the vibrator element 20. The base portions of the elastic metal members or portions 40, 40', 42 and 42' may therefore be securely fitted to the side faces of the members or portions 40, 40', 42 and 42' simply by the spring actions of the ridge portions without aid of a metal-to-metal adhesive which may be preferably used to fixedly bond the base portions to the arm portions 22 and 22' of the vibrator element 20 as previously mentioned. To facilitate the base portions of the elastic metal members or portions 40, 40', 42 and 42' to be slipped on to the side faces of the arm portions 22 and 22' of the vibrator element 20 during assembly of the filter device, the base portions may be formed with laterally outwardly curved or bent free edges opposite to the ridge portions 44 and 46, as indicated by reference numerals 48 and 50 in FIG. 4.

FIG. 5 illustrates part of another preferred embodiment of the reed type electromechanical filter device according to the present invention. The filter device shown in FIG. 5 is essentially similar to the embodiment illustrated in FIG. 2 but is distinguishable therefrom by the arrangement in which the elastic metal members are mounted on the arm portions of the vibrator element. Referring to FIG. 5, the filter device comprises a pair of elastic metal members 52 and 52' mounted on the outer and inner side faces, respectively, of one arm portion 22 of the vibrator element 20 and a pair of elastic metal members 54 and 54' mounted on the outer and inner side faces, respectively, of the other arm portion 22' of the vibrator element 20. The elastic metal members 52 and 52' on the arm portion 22 of the vibrator element 20 have respective base portions (designated by 52a for the metal member 52, for example). The base portions of the elastic metal members 52 and 52' extend along one longitudinal edge of the arm portion 22 and are fixedly attached to the outer and inner side faces, respectively, of the arm portion 20 by means of a metal-to-metal adhesive. The elastic metal members 52 and 52' further have respective overhang portions (designated by 52b for the metal member 52, for example) which extend from the base portions of the metal members 52 and 52' toward the other longitudinal edge of the arm portion 22 of the vibrator element 20 and which jut over the outer and inner side faces, respectively, of the arm portion 22. The elastic metal members 54 and 54' mounted on the other arm portion 22' of the vibrator element 20 are configured similarly to the metal members 52 and 52' on the arm portion 22, having respective base portions fixedly bonded to the outer and inner side faces, respectively, and extending along one longitudinal edge of the arm portion 22' and respective overhang portions extending from the base portions toward the other longitudinal edge of the arm portion 22' and jutting over the outer and inner side faces, respectively, of the arm portion 22'. The overhang portions of the elastic metal members 52, 52', 54 and 54' are substantially similarly spaced apart from the side faces of the arm portions 22 and 22' on which are metal members are mounted and are thus elastically movable or deformable toward and away from the side faces of the arm portions 22 and 22' of the vibrator element 20 when external forces are exerted on the overhang portions in directions in which the arm portions 22 and 22' are to vibrate. The elastic metal members 52, 52', 54 and 54' are preferably located in the vicinity of the free ends of the arm portions 22 and 22' carrying the metal members, as shown. As is the case with the embodiment of FIG. 2, design considerations should be paid attention to so that the elastic metal members 52, 52', 54 and 54' are prevented from contacting each other and the inner faces of the side walls 16 and 16' of the housing 12 (FIG. 2) when the arm portions 22 and 22' of the vibrator element 20 are caused to vibrate under normal operating conditions of the filter device. The elastic metal members 52, 52', 54 and 54' thus arranged in the embodiment shown in FIG. 5 function essentially similarly to their counterparts of the embodiment shown in FIG. 2 and are thus effective to prevent the arm portions 22 and 22' of the vibrator element 20 from being unusually warped in lateral directions when the filter device happens to be subjected to a violent impact that would otherwise cause the arm portions 22 and 22' to unusually warp.

Figure 4:
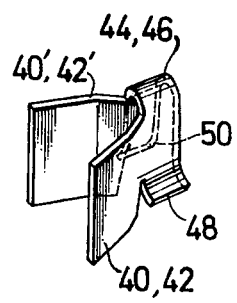
FIG. 4 is a perspective view showing, to an enlarged scale, the detailed configuration of each of the elastic metal members incorporated in the embodiment illustrated in FIG. 3.

Similarly to the embodiment shown in FIGS. 3 and 4, the elastic metal members 52, 52', 54 and 54' may be arranged in such a manner that the metal members 52 and 52' on the arm portion 22 of the vibrator element 20 are integrally connected together by a ridge portion 56 and, likewise, the metal members 54 and 54' on the arm portion 22' of the vibrator element 20 are integrally connected together by a ridge portion 58 as shown in FIG. 6. The ridge portion 56 bridging the elastic metal members or, more exactly, portions 52 and 52' saddles over one longitudinal edge of the arm portion 22 and merges into the respective base portions of the metal members or portions 52 and 52' on the arm portion 22. Similarly, the ridge portion 58 bridging the elastic metal members or portions 54 and 54' saddles over one longitudinal edge of the arm portion 22' and merges into the respective base portions of the metal members or portions 54 and 54' on the arm portion 22'. The ridge portions 56 and 58 are formed of elastic metal and have spring actions by virtue of which the respective base portions of the elastic metal members or portions 52, 52', 54 and 54' are urged against the side faces of the arm portions 22 and 22' carrying the metal members. The base portions of the elastic metal members or portions 52, 52', 54 and 54' may therefore be securely fitted to the side faces of the arm portions 22 and 22' of the vibrator element 20 simply by the spring actions of the ridge portions without aid of a metal-to-metal adhesive although bonding the base portions of the metal members 52, 52', 54 and 54' to the arm portions 22 and 22' by the use of such an adhesive is preferred.

FIG. 7 illustrates part of still another preferred embodiment of the reed type electromechanical filter device according to the present invention. The filter device shown in FIG. 7 comprises, in addition to a vibrator element 20 and other members which are usually incorporated in a prior art filter device of the described character, a pair of elastic metal members 60 and 60' which are mounted on the arm portions 22 and and 22', respectively, of the vibrator element 20. The elastic metal member 60 on the arm portion 22 of the vibrator 20 consists of a pair of base wall portions 62 and 62' fixedly attached to the outer and inner side faces, respectively, of the arm portion 22 by means of a metal-to-metal adhesive, a pair of side wall portions 64 and 64' having generally arcuate cross sections and merging out of the base wall portions 62 and 62', respectively, and a top wall portion 66 through which the side wall portions 64 and 64' merge into each other. The side wall portions 64 and 64' are spaced apart from the outer and inner side faces, respectively, of the arm portion 22 of the vibrator element 20 while the top wall portion 66 extends over one longitudinal edge of the arm portion 22, as shown. The elastic metal member 60 on the other arm portion 22' is configured similarly to the elastic metal member 60 above described and, thus, has a pair of base wall portions 68 and 68' fixedly attached to the outer and inner side faces, respectively, of the arm portion 22' by a metal-to-metal adhesive, a pair of side wall portions 70 and 70' having generally arcuate cross sections and merging out of the base wall portions 68 and 68', respectively, and a top wall portion 72 which extends over one longitudinal edge of the arm portion 22' and through which the side wall portions 70 and 70' merge into each other. The elastic metal members 60 and 60' thus configured are preferably located in proximity to the free ends of the arm portions 22 and 22' respectively, of the vibrator element 20. The side wall portions 64 and 64' of the elastic metal member 60 and the side wall portions 70 and 70' of the elastic metal member 60' are adapted to be elastically compressed toward the side faces of the arm portions 22 and 22' on which are metal members are mounted when caused to forcefully strike against each other or against the inner faces of the side walls 16 and 16' of the housing 12 (FIG. 2). The elastic metal members 60 and 60' of the above described embodiment thus function essentially similarly to the elastic metal members 40, 40', 42 and 42' of the embodiment shown in FIG. 2 or 3 or to the elastic metal members 52, 52', 54 and 54' of the embodiment shown in FIG. 5 or 6. The behaviours of the elastic metal members 60 and 60' responsive to an impact ap applied to the filter device provided with the members will therefore be self-explanatory from the previous description made in connection with the embodiment illustrated in FIG. 2 and, for this reason, may not be further discussed.

FIG. 8 illustrates part of still another preferred embodiment of the reed type electromechanical filter device according to the present invention. While each of the embodiments thus far described with reference to FIGS. 2 to 7 uses the elastic metal members serving as leaf springs, the embodiment shown in FIG. 8 is characterized in that elastic metal members in the form of helical springs are used for the protection of the vibrator element. Thus, the embodiment of the filter device shown in FIG. 8 comprises, in addition to a vibrator element 20 and other members essential to the prior art filter device of the described character, a pair of cylindrical helical springs 74 and 74' which are seated each at one end on the outer side faces of the arm portions 22 and 22', respectively, of the vibrator element and a cylindrical helical spring 76 which is seated between the inner side faces of the arm portions 22 and 22' of the vibrator element 20. The helical springs 74, 74' and 76 have respective longitudinal axes which are substantially normal to the side faces of the arm portions 22 and 22' of the vibrator element 20 and which are preferably in alignment with each other as illustrated. The helical springs 74, 74' and 76 are, furthermore, preferably located in the neighbourhood of the free ends of the arm portions 22 and 22' of the vibrator element 20. The helical springs 74 and 74' seated on the outer side faces of the arm portions 22 and 22' respectively, of the vibrator element 20 have free ends and are adapted to be axially compressed when the arm portions 22 and 22' are caused to warp laterally outwardly away from each other and consequently the springs 74 and 74' are forced against the inner faces of the side walls 16 and 16' of the housing 12 (FIG. 2) due to an impact exerted on the filter device. The springs 74 and 74' on the outer side faces of the arm portions 22 and 22', respectively, are thus effective to limit outward warping of the arm portions 22 and 22' of the vibrator element in the event an impact is exerted on the filter device. On the other hand, the helical spring 76 seated between the inner side faces of the arm portions 22 and 22' of the vibrator element 20 is adapted to be axially extended when the arm portions 22 and 22' are caused to laterally outwardly warp away from each other and to be axially compressed when the arm portions 22 and 22' are caused to laterally inwardly warp toward each other. When extended with the arm portions 22 and 22' warped away from each other, the helical spring 76 acts as a tension spring which contributes to urging the arm portions 22 and 22' laterally inwardly toward their initial straight positions and, when compressed with the arm portions 22 and 22' warped toward each other, the spring 76 acts as a compression spring which urges the arm portions laterally outwardly toward their initial straight positions. The springs 74, 74' and 76 are thus adapted to prevent the arm portions 22 and 22' of the vibrator element 20 from being excessively warped in lateral directions and from directly contacting each other and the inner faces of the side walls 16 and 16' of the housing 12 (FIG. 2) and to dampen outer mechanical shocks applied to the vibrator element 20 when the filter device is subjected to a violent impact.

While the helical springs 74, 74' and 76 have been assumed to be constructed separately of each other, they may be formed as an integral member which is securely carried on the arm portions 22 and 22' of the vibrator element 20 in such a manner that adjacent two helices of the unitary spring are fast on the outer and inner side faces of each of the arm portions 22 and 22'. Although, furthermore, the helical springs 74 and 74' attached to the outer side faces of the arm portions 22 and 22' of the vibrator element 20 have been assumed to be of the cylindrical configurations they may be replaced with conical helical springs if desired.

As previously noted, it is ordinarily practised to have the arm portions 22 and 22' of the vibrator element 20 coated with controlled quantities of adhesive so as to furnish the vibrator element 20 with additional masses for minute adjustment of the resonance frequency of the vibrator element 20. The adhesive tends to flow on the surfaces of the vibrator element and it has therefore been difficult to accurately control the quantities, locations and distribution of the additional masses in a conventional filter device of the described character. Such a difficulty can be readily eliminated in the filter device according to the present invention in which the elastic metal members mounted on the vibrator element can be utilized not only for the purpose of protecting the vibrator element from shocks but to retain the adhesive applied to the surfaces of the vibrator element. FIG. 9 illustrates an embodiment in which an adhesive is applied, for the above mentioned purpose, to a vibrator element 20 carrying elastic metal members 40, 40', 42 and 42' arranged as in the embodiment shown in FIG. 2, whereas FIG. 10 illustrates an embodiment in which an adhesive is applied for the same purpose to a vibrator element 20 carrying elastic metal members 60 and 60' which are arranged as in the embodiment shown in FIG. 7.

Referring to FIG. 9, an adhesive is applied to an interspace between each side face of each of the arm portions 22 and 22' of the vibrator element 20 and the inner face of a boundary portion (designated by 40c for the elastic metal member 40, for example) between the base and overhang portions (designated by 40a and 40b, respectively, for the elastic metal member 40) of each of the elastic metal members 40, 40', 42 and 42' so as to form additional masses which are commonly designated by reference numeral 78. The adhesive thus applied to the vibrator element 20 is initially in a liquid state and thus tends to creep over the surfaces of the arm portions 22 and 22' of the vibrator element 20. The quantities of the adhesive on the arm portions 22 and 22' are, however, retained by the elastic metal members 40, 40', 42 and 42' and are therefore prevented from creeping on the surfaces of the arm portions 22 and 22' while the adhesive remains liquid. As the time lapses, the adhesive is set and becomes fast on the arm portions 22 and 22' and the elastic metal members 40, 40', 42 and 42'.

In the embodiment illustrated in FIG. 10, an adhesive is applied to the inner face of a boundary portion (designated by 80 for the elastic metal member 60, for example) between the base and side wall portions (62 and 64, respectively, for the elastic metal member 60) of each of the elastic metal members 60 and 60' so as to form additional masses which are commonly designated by reference numeral 82.

It is apparent that an adhesive can be applied, for the purpose of minutely adjusting the resonance frequency of the vibrator element, to the vibrator element of each of the embodiments of FIGS. 3, 5 and 6 substantially in the same manner as described in connection with the embodiment shown in FIG. 9. In the case of the embodiment illustrated in FIG. 8, an adhesive may be applied along that helix of each of the helical springs 74, 74' and 76 which is in contact with the surface of each of the arm portions 22 and 22' of the vibrator element 20.

In the embodiment illustrated in FIG. 3, 6 or 7 in which the elastic metal members may be fixedly mounted on the arm portions of the vibrator without use of a metal-to-metal adhesive, the resonance frequency achieved by the vibrator element may be minutely adjusted by varying the positions of the elastic metal members longitudinally relative to the arm portions of the vibrator element. If the helical springs 74, 74' and 76 of the embodiment shown in FIG. 8 are formed as an integral unitary member as previously mentioned, the resonance frequency of the vibrator element 20 may also be minutely adjusted by moving the unitary spring longitudinally relative to the arm portions 22 and 22' of the vibrator element 20.

While each of the embodiments of the filter device according to the present invention has been described and shown as comprising elastic metal members which are mounted on both of the outer and inner side faces of each of the arm portions of the vibrator element, the elastic metal members may be attached only to the outer or inner side faces of the arm portions of the vibrator element if desired. If, for instance, only a limited space is provided between each of the arm portions of the vibrator element and the inner face of each of the side walls of the housing so that the arm portions of the vibrator element will not be allowed to laterally outwardly warp at relatively large angles, then the elastic metal members may be attached only to the inner side faces of the arm portions of the vibrator element with the outer side faces of the arm portions kept plain. If, on the contrary, the vibrator element is so designed as to have a relatively narrow spacing between the two arm portions of the element so that the arm portions are not likely to be laterally inwardly warped at relatively large angles, then the elastic metal members may be attached only to the outer side faces of the arm portions of the vibrator element with the inner side faces of the arm portions kept plain.

From the foregoing description it will have been clearly understood that the reed type electromechanical filter device according to the present invention is advantageous in that the arm portions of the vibrator element are prevented from being excessively warped and accordingly the piezoelectric ceramic plates carried on the arm portions are prevented from being seriously damaged even when the filter device is subjected to a violent impact and in that the resonance frequency of the vibrator element can be readily and accurately calibrated through application of controlled quantities of adhesive to the vibrator element during production of the filter device. In addition to these advantages, the filter device according to the present invention is advantageous in that, because the elastic metal members mounted on the vibrator element are formed of metal, the metal members can be readily inspected from the outside of the housing if an x-ray radiographic testing method is used which is useless for the inspection of rubbery or polymeric materials. The filter device according to the present invention. is thus expected to facilitate quality control because the elastic metal members found to be improperly mounted on the vibrator element can be readily exchanged with new ones or may be re-adjusted for proper positions before the filter device is delivered ex factory.

While various preferred embodiments of the reed type electromechanical filter device have thus far been described, it should be borne in mind that such embodiments are merely for the illustration of the gist of the present invention and may be modified and changed in numerous manners if desired.

What is claimed is:

1. A reed type electromechanical filter device comprising: a vibrator element having a base portion, a pair of spaced parallel arm portions which merge at respective fixed ends thereof into said base portion disposed intermediate the arm portions to define a nodal axis of vibration thereat and which have respective free ends opposite to said intermediate base portion, a pair of electromechanical transducer elements each fixedly mounted on a respective one of said arm portions in the neighborhood of said intermediate base portion, and a pair of elastic metal members each attached to the outer side face of a respective one of said arm portions in the neighborhood of said free ends and elastically deformable in directions in which the arm portions are free to vibrate; and a housing enclosing therein said vibrator element, said transducer elements and said elastic metal members with said intermediate base portion of said vibrator element fixedly mounted on an inner face of the housing.

2. A reed type electromechanical filter device as claimed in claim 1, further comprising: a pair of elastic metal members each fixedly mounted on the inner side face of a respective on of said arm portions of said vibrator element and elastically deformable in said directions in which said arm portions are free to vibrate.

3. A reed type electromechanical filter device as claimed in claim 2, in which the elastic metal members attached to the outer and inner faces of each respective one of said arm portions of the vibrator element further comprise a ridge portion straddling over one longitudinal edge of the respective arm portion and integral with the elastic metal members attached to the respective arm portion.

4. A reed type electromechanical filter device as claimed in claim 3, in which said elastic metal members on the outer and inner side faces of each of said arm portions of the vibrator have respective substantially flat base portions fixedly attached to the outer and inner side faces, respectively, of each arm portion and longitudinally spaced apart from the free end of the arm portion, and respective overhang portions which extend from said base portions of said elastic metal members toward the free end of the arm portion and which are spaced apart from the outer and inner side faces, respectively, of the arm portion to which the elastic metal members are attached.

5. A reed type electromechanical filter device as claimed in claim 4, in which said ridge portion is integral with said base portions of said elastic metal members on each of said arm portions of the vibrator element.

6. A reed type electromechanical filter device as claimed in claim 3, in which said elastic metal members on the outer and inner side faces of each of said arm portions of the vibrator element have respective substantially flat base portions fixedly attached to the outer and inner side faces, respectively, of each arm portion, and respective overhang portions extending from said base portions of said elastic metal members toward said longitudinal edge of the arm portion to which the elastic members are attached.

7. A reed type electromechanical filter device as claimed in claim 6, in which said ridge portion is integral with said base portions of said elastic metal members on each of said arm portions of the vibrator element.

8. A reed type electromechanical filter device comprising: a vibrator element having a base portion, a pair of spaced parallel arm portions which merge at respective fixed ends thereof into said base portion disposed intermediate the arm portions to define a nodal axis of vibration thereat and which have respective free ends opposite to said intermediate base portion, a pair of electromechanical transducer elements each fixedly mounted on a respective one of said arm portions in the neighborhood of said intermediate base portion, and a pair of elastic metal members each attached to the inner side face of a respective one of said arm portions in the neighborhood of said free ends and elastically deformable in directions in which the arm portions are free to vibrate; and a housing enclosing therein said vibrator element, said transducer elements and said elastic metal members with said intermediate base portion of said vibrator element fixedly mounted on an inner face of the housing.

9. A reed type electromechanical filter device as claimed in claim 8, further comprising: a pair of elastic metal members each fixedly mounted on the outer side face of a respective one of said arm portions of said vibrator element and elastically deformable in said directions in which said arm portions are free to vibrate.

10. A reed type electromechanical filter device comprising: a vibrator element having a base portion, a pair of spaced parallel arm portions which merge at respective fixed ends thereof into said base portion disposed intermediate the arm portions to define a nodal axis of vibration thereat and which have respective free ends opposite to said intermediate base portion, a pair of electromechanical transducer elements each fixedly mounted on a respective one of said arm portions in the neighborhood of said intermediate base portion, and a pair of elastic metal members each mounted on a respective one of said arm portions in the neighborhood of said free ends and elastically deformable in directions in which the arm portions are free to vibrate, each of said elastic metal members having a substantially flat base portion fixedly attached to a respective one of the arm portions of the vibrator element and longitudinally spaced apart from the free end of the respective arm portion, and an overhang portion which extends from said base portion toward the free end of the respective arm portion carrying the elastic metal member and which is spaced apart from the side face of the respective arm portion to which the elastic metal member is attached; and a housing enclosing therein said vibrator element, said transducer elements and said elastic metal members with said intermediate base portion of said vibrator element fixedly mounted on an inner face of the housing.

11. A reed type electromechanical filter device comprising: a vibrator element having a base portion, a pair of spaced parallel arm portions which merge at respective fixed ends thereof into said base portion disposed intermediate the arm portions to define a nodal axis of vibration thereat and which have respective free ends opposite to said intermediate base portion, a pair of electromechanical transducer elements each fixedly mounted on a respective one of said arm portions in the neighborhood of said intermediate base portion, and a pair of elastic metal members each mounted on a respective one of said arm portions in the neighborhood of said free ends and elastically deformable in directions in which the arm portions are free to vibrate, each of said elastic metal members having a substantially flat base portion fixedly attached to a respective one of the arm portions of said vibrator element and spaced apart from one longitudinal edge of the respective arm portion, and an overhang portion which extends from said base portion toward said longitudinal edge of the respective arm portion and spaced apart from the side face of the respective arm portion on which the elastic metal member is mounted; and a housing enclosing therein said vibrator element, said transducer elements and said elastic metal members and having said intermediate base portion of said vibrator element fixedly mounted on an inner face of the housing.

12. A reed type electromechanical filter device comprising: a vibrator element having a base portion, a pair of spaced parallel arm portions which merge at respective fixed ends thereof into said base portion disposed intermediate the arm portions to define a nodal axis of vibration thereat and which have respective free ends opposite to said intermediate base portion, a pair of electromechanical transducer elements each fixedly mounted on a respective one of said arm portions in the neighborhood of said intermediate base portion, and a pair of elastic metal members each mounted on a respective one of said arm portions in the neighborhood of said free ends and elastically deformable in directions in which the arm portions are free to vibrate, each of said elastic metal members consisting of a pair of substantially flat base wall portions fixedly attached to the outer and inner side faces respectively, of a respective one of said arm portions of the vibrator element, a pair of side wall portions having substantially arcuate cross sections and spaced apart from the outer and inner side faces of the respective arm portion, and a top wall portion which extends over one longitudinal edge of the respective arm portion and through which said side wall portions merge; and a housing enclosing therein said vibrator element, said transducer elements and said elastic metal members with said intermediate base portion of said vibrator element fixedly mounted on an inner face of the housing.

13. A reed type electromechanical filter device comprising: a vibrator element having a base portion, a pair of spaced parallel arm portions which merge at respective fixed ends thereof into said base portion disposed intermediate the arm portions to define a nodal axis of vibration thereat and which have respective free ends opposite to said intermediate base portion, a pair of electromechanical transducer elements each fixedly mounted on a respective one of said arm portions in the neighborhood of said intermediate base portion, and a pair of elastic metal members each mounted on a respective one of said arm portions in the neighborhood of said free ends and elastically deformable in directions in which the arm portions are free to vibrate, each of said elastic metal members consisting of a helical spring which is mounted on the outer side face of a respective one of said arm portions of said vibrator element and which extends substantially perpendicularly from the outer side face of the respective arm portion on which the helical spring is mounted; and a housing enclosing therein said vibrator element, said transducer elements and said elastic metal members with said intermediate base portion of said vibrator element fixedly mounted on an inner face of the housing.

14. A reed type electromechanical filter device as claimed in claim 13, further comprising: a helical spring connected between the inner side faces of said arm portions of said vibrator element.

15. A reed type electromechanical filter device as claimed in claim 14, in which said helical spring connected between the inner side faces of said arm portions is substantially aligned with the helical springs mounted on the outer side faces of said arm portions.

16. A reed type electromechanical filter device as claimed in claim 15, in which all of said helical springs are integrally connected together.

17. A reed type electromechanical filter device comprising: a vibrator element having a base portion, a pair of spaced parallel arm portions which merge at respective fixed ends thereof into said base portion disposed intermediate the arm portions to define a nodal axis of vibration thereat and which have respective free ends opposite to said intermediate base portion, a pair of electromechanical transducer elements each fixedly mounted on a respective one of said arm portions in the neighborhood of said intermediate base portion, a pair of elastic metal members each mounted on a respective one of said arm portions in the neighborhood of said free ends and elastically deformable in directions in which the arm portions are free to vibrate, and an additional mass of metal-to-metal adhesive applied to an interspace formed by each of said elastic metal members and located in the vicinity of the side face of each of said arm portions of said vibrator element; and a housing enclosing therein said vibrator element, said transducer elements and said elastic metal members with said intermediate base portion of said vibrator element fixedly mounted on an inner face of the housing.

18. A reed type electromechanical filter device as claimed in claim 17, in which said interspace is formed between the side face of each of said arm portions of the vibrator element and a portion of each of said elastic metal members which is in close proximity to said face of the arm portion.

19. A reed type electromechanical filter device as claimed in claim 18, in which each of said elastic metal members has a curved portion having an inner face defining said interspace.

* * * * *